United States Patent
Song et al.

(10) Patent No.: US 10,403,694 B2
(45) Date of Patent: Sep. 3, 2019

(54) OLED SUBSTRATE COMPRISING CORRESPONDING PIXEL DEFINITION LAYER PATTERNS, MANUFACTURING METHOD THEREOF, AND DISPLAY DEVICE

(71) Applicant: Boe Technology Group Co., Ltd., Beijing (CN)

(72) Inventors: Yingying Song, Beijing (CN); Hsiaowen Hung, Beijing (CN); Haochih Hung, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 37 days.

(21) Appl. No.: 15/124,444

(22) PCT Filed: Jul. 30, 2015

(86) PCT No.: PCT/CN2015/085574
§ 371 (c)(1),
(2) Date: Sep. 8, 2016

(87) PCT Pub. No.: WO2016/165238
PCT Pub. Date: Oct. 20, 2016

(65) Prior Publication Data
US 2017/0084674 A1 Mar. 23, 2017

(30) Foreign Application Priority Data
Apr. 17, 2015 (CN) .......................... 2015 1 0185625

(51) Int. Cl.
*H01L 27/32* (2006.01)
*H01L 51/50* (2006.01)
(Continued)

(52) U.S. Cl.
CPC .......... *H01L 27/3246* (2013.01); *H01L 27/12* (2013.01); *H01L 27/3276* (2013.01);
(Continued)

(58) Field of Classification Search
CPC ............. H01L 27/3246; H01L 27/3276; H01L 51/5209; H01L 51/5212; H01L 51/5225; H01L 51/5228
See application file for complete search history.

(56) References Cited

U.S. PATENT DOCUMENTS 8,508,124 B2    8/2013  Min
2005/0179377 A1*  8/2005  Shitagami ........... H01L 27/3223
                                                    313/512
(Continued)

FOREIGN PATENT DOCUMENTS

CN    101814522 A    8/2010
CN    101867023        10/2010
(Continued)

OTHER PUBLICATIONS

Third Office Action forChina Application No. 201510185625.4 dated Apr. 12, 2017.
(Continued)

*Primary Examiner* — Mohsen Ahmadi
*Assistant Examiner* — Christopher M Roland
(74) *Attorney, Agent, or Firm* — Calfee, Halter & Griswold LLP

(57) ABSTRACT

The present disclosure provides an OLED substrate, a manufacturing method thereof, and a display device. The OLED substrate comprises: a base substrate; a source-drain metal extending portion arranged on the base substrate; a passivation layer having via holes at positions corresponding to cathode contact regions in a peripheral area; an anode metal extending portion being electrically connected with the source-drain metal extending portion through the via holes; a pixel definition layer having first patterns at positions corresponding to a display area, each having a protrusion portion and a groove portion; the pixel definition layer having second patterns at positions corresponding to the
(Continued)

cathode contact regions, each having a protrusion portion and a groove portion. The protrusion portion of the first pattern corresponds to the groove portion of the second pattern, and the groove portion of the first pattern corresponds to the protrusion portion of the second pattern.

13 Claims, 2 Drawing Sheets

(51) Int. Cl.
*H01L 51/52* (2006.01)
*H01L 51/00* (2006.01)
*H01L 27/12* (2006.01)

(52) U.S. Cl.
CPC ...... *H01L 51/0004* (2013.01); *H01L 51/5209* (2013.01); *H01L 51/5212* (2013.01); *H01L 51/5228* (2013.01); *H01L 51/5012* (2013.01); *H01L 51/5225* (2013.01); *H01L 2227/323* (2013.01)

(56) References Cited

U.S. PATENT DOCUMENTS

| | | | | |
|---|---|---|---|---|
| 2005/0264177 | A1* | 12/2005 | Chung | H01L 27/3223 313/503 |
| 2007/0159089 | A1* | 7/2007 | Oh | H01L 27/3223 313/506 |
| 2010/0213482 | A1 | 8/2010 | Kim et al. | |
| 2012/0229437 | A1* | 9/2012 | Park | H01L 27/3276 345/211 |
| 2013/0113368 | A1 | 5/2013 | Min | |
| 2014/0062290 | A1 | 3/2014 | Kim | |
| 2014/0319477 | A1 | 10/2014 | Kim | |
| 2015/0060819 | A1 | 3/2015 | Sato et al. | |
| 2016/0035980 | A1 | 2/2016 | Kong et al. | |

FOREIGN PATENT DOCUMENTS

| | | |
|---|---|---|
| CN | 103545345 A | 1/2014 |
| CN | 103682143 | 3/2014 |
| CN | 103682143 A | 3/2014 |
| CN | 104124266 | 10/2014 |
| CN | 104124266 A | 10/2014 |
| CN | 104425559 | 3/2015 |
| CN | 104425559 A | 3/2015 |
| CN | 104766930 | 7/2015 |
| TW | 201327795 A | 7/2013 |

OTHER PUBLICATIONS

International Search Report and Written Opinion from PCT/CN15/85574 dated Jan. 18, 2016.

Office action from Chinese Application No. 201510185625.4 dated Jul. 5, 2016.

Office Action from China Application No. 201510185625.4 dated Dec. 12, 2016.

* cited by examiner

--Prior Art--

--Prior Art--

OLED SUBSTRATE COMPRISING CORRESPONDING PIXEL DEFINITION LAYER PATTERNS, MANUFACTURING METHOD THEREOF, AND DISPLAY DEVICE

RELATED APPLICATIONS

The present application is the U.S. national phase entry of PCT/CN2015/085574, with an international filing date of Jul. 30, 2015, which claims the benefit of Chinese Patent Application No. 201510185625.4, filed Apr. 17, 2015, the entire disclosures of which are incorporated herein by reference.

TECHNICAL FIELD

The present disclosure belongs to the field of display technology, particularly to an OLED substrate, a manufacturing method thereof, and a display device.

BACKGROUND

The organic light-emitting device (OLED) has broad application because it has the advantages of simple manufacturing process, low cost, low power consumption, high luminance, and wide adaptation range of the working temperature etc.

The OLED has extremely wide applications in the area of displays. Specifically, an OLED substrate is taken as an example for illustration. As shown in FIG. 1 and FIG. 2, the OLED substrate comprises a display area 1, and a peripheral area 2 around the display area 1. The peripheral area 2 comprises a plurality of cathode contact regions 21. A source-drain (SD) metal extending portion 11 is formed on a base substrate 10 of the OLED substrate. The source-drain metal extending portion 11 extends from the display area to the cathode contact regions of the peripheral area. A passivation layer 12 (PVX) is formed on a layer where the source-drain metal extending portion 11 locates, and a plurality of via holes are formed in the passivation layer 12 located in the cathode contact regions. An anode and an anode metal extending portion of the OLED device are formed on the passivation layer 12. The anode of the OLED device is located in the display area, and is arranged in a same layer as the anode metal extending portion 13. The anode metal extending portion 13 also extends from the display area to the cathode contact regions of the peripheral area. The anode metal extending portion 13 is connected with the source-drain metal extending portion 11 at the cathode contact regions through the via holes. A pixel definition layer 14 is formed on the layer where the anode and the anode metal extending portion of the OLED device locate. The pixel definition layer 14 comprises first openings located in the display area and second openings located in the cathode contact regions of the peripheral area. Each of the first openings is used for accommodating the light emitting material of an OLED device. The width of the second opening is much larger than the width of the first opening, and the width of the second opening is even larger than the width of the cathode contact region. After the pixel definition layer 14 is formed, an organic light emitting material layer is formed on the whole OLED base substrate 10 through continuous printing. Because the peripheral area is not used for displaying, here the organic light emitting material at the position of the peripheral area has to be cleaned. Finally the cathode and the cathode metal extending portion of the OLED device are formed. The cathode of the OLED device is located in the display area and is connected with the anode metal extending portion 13. The cathode metal extending portion extends from the display area to the cathode contact regions of the peripheral area.

SUMMARY

It is desired to provide an OLED substrate, for which the cleaning is convenient and even the step of cleaning up the light emitting material may be omitted, a manufacturing method thereof, and a display device.

According to an aspect of the present disclosure, an OLED substrate is provided. The OLED substrate may be divided into a display area and a peripheral area around the display area, the peripheral area having a plurality of cathode contact regions. The OLED substrate comprises: a base substrate, a source-drain metal extending portion arranged on the base substrate, and the source-drain metal extending portion extending from the display area to the cathode contact regions of the peripheral area, a passivation layer arranged on a layer where the source-drain metal extending portion locates, and the passivation layer having a plurality of via holes at positions corresponding to the cathode contact regions, an anode metal extending portion arranged on the passivation layer, and the anode metal extending portion extending from the display area to the cathode contact regions of the peripheral area and being electrically connected with the source-drain metal extending portion through the via holes, a pixel definition layer arranged on a layer where the anode metal extending portion locates, and the pixel definition layer having a plurality of successively arranged first patterns at positions corresponding to the display area, each of the first patterns having a protrusion portion and a groove portion, the pixel definition layer having a plurality of successively arranged second patterns at positions corresponding to the cathode contact regions, each of the second pattern having a protrusion portion and a groove portion. The protrusion portion of the first pattern corresponds to the groove portion of the second pattern, and the groove portion of the first pattern corresponds to the protrusion portion of the second pattern.

In certain embodiments, a width of the protrusion portion of the first pattern is same as a width of the groove portion of the second pattern, and a width of the groove portion of the first pattern is same as a width of the protrusion portion of the second pattern.

In certain embodiments, the OLED substrate further comprises a light emitting material layer, the light emitting material layer is arranged in the groove portion of the first pattern and on the protrusion portion of the second pattern.

In certain embodiments, the OLED substrate further comprises a cathode and a cathode metal extending portion connected with the cathode. The cathode and the cathode metal extending portion are arranged on the light emitting material layer, and the cathode is arranged in the display area, the cathode metal extending portion extends from the display area to the cathode contact regions of the peripheral area and is connected with the anode metal extending portion through the groove portion of the second pattern.

In certain embodiments, the OLED substrate further comprises an anode arranged in the display area, and the anode is arranged in a same layer as the anode metal extending portion and is disconnected from the anode metal extending portion.

According to another aspect of the disclosure, there is provided a manufacturing method of an OLED substrate, comprising the steps of:

forming, on a base substrate, a pattern comprising a source-drain metal extending portion through a patterning process, the source-drain metal extending portion extending from a display area to cathode contact regions of a peripheral area;

forming a passivation layer on the base substrate where the above step has been performed, and forming a plurality of via holes at positions corresponding to the cathode contact regions in the passivation layer through a patterning process;

forming, on the base substrate where the above steps have been performed, a pattern comprising an anode metal extending portion through a patterning process, the anode metal extending portion extending from the display area to the cathode contact regions of the peripheral area and being electrically connected with the source-drain metal extending portion through the via holes;

forming a pixel definition layer on the base substrate where the above steps have been performed, and forming a plurality of successively arranged first patterns at positions corresponding to the display area in the pixel definition layer through a patterning process, each of the first patterns having a protrusion portion and a groove portion, forming a plurality of successively arranged second patterns at positions corresponding to the cathode contact regions of the peripheral area in the pixel definition layer, each of the second pattern having a protrusion portion and a groove portion, the protrusion portion of the first pattern corresponding to the groove portion of the second pattern, and the groove portion of the first pattern corresponding to the protrusion portion of the second pattern.

In certain embodiments, a width of the protrusion portion of the first pattern is same as a width of the groove portion of the second pattern, and a width of the groove portion of the first pattern is same as a width of the protrusion portion of the second pattern.

In certain embodiments, after the step of forming the pixel definition layer, the method further comprises forming a light emitting material layer, the light emitting material layer is formed in the groove portion of the first pattern and on the protrusion portion of the second pattern.

Further in certain embodiments, the light emitting material layer is formed by continuous printing.

Further in certain embodiments, after the step of forming the light emitting material layer, the method further comprises forming a pattern comprising a cathode and a cathode metal extending portion connected with the cathode through a patterning process. The cathode and the cathode metal extending portion are arranged on the light emitting material layer, and the cathode is arranged in the display area, the cathode metal extending portion extends from the display area to the cathode contact regions of the peripheral area and is connected with the anode metal extending portion through the groove portion of the second pattern.

In certain embodiments, an anode is further formed while forming the anode metal extending portion, and the anode is arranged in a same layer as the anode metal extending portion and is disconnected from the anode metal extending portion.

According to yet another aspect of the disclosure, a display device comprising an OLED substrate as described above is provided.

The pixel definition layer of the present disclosure has a plurality of successively arranged first patterns at positions corresponding to the display area and a plurality of successively arranged second patterns at positions corresponding to the cathode contact regions of the peripheral area, moreover, the protrusion portion of the first pattern corresponds to the groove portion of the second pattern, and the groove portion of the first pattern corresponds to the protrusion portion of the second pattern; in other words, the first pattern and the second pattern are opposite patterns. Therefore, when printing a light emitting material in the pixel definition layer by continuous printing so as to form a light emitting material layer of the OLED device, the light emitting material will not be printed into the groove portion of the second pattern while only being left on the protrusion portion of the second pattern, thus the problem of being difficult to clean up the light emitting material falling into positions under the groove portion of the second pattern corresponding to the via holes of the passivation layer is avoided.

DETAILED DESCRIPTION OF THE DISCLOSURE

In order to enable the skilled person in the art to understand the technical solution of the present disclosure better, the present disclosure will be described in more detail with reference to the drawings and the specific embodiments.

Reference signs: 1—display area; 2—peripheral area; 3—cathode contact region; 10—base substrate; 11—source-drain metal extending portion; 12—passivation layer; 13—anode metal extending portion; 14—pixel definition layer; 15—light emitting material layer; 16—cathode metal extending portion; 100—first pattern; 101—groove portion of the first pattern; 102—protrusion portion of the first pattern; 200—second pattern; 201—groove portion of the second pattern; 202—protrusion portion of the second pattern.

Figure 1:
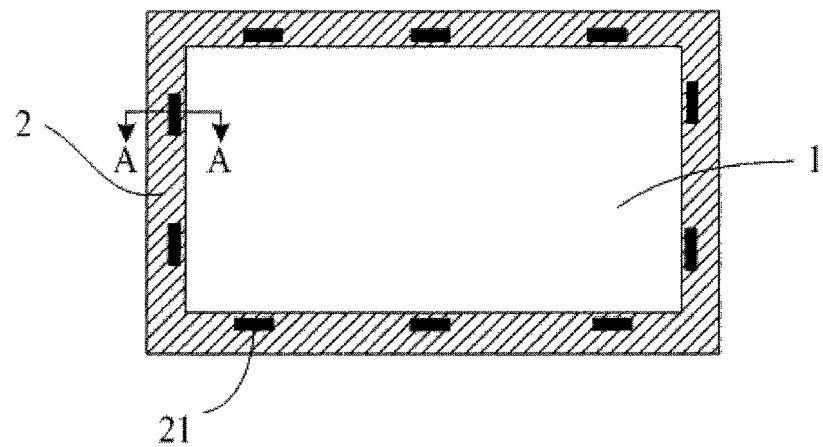
FIG. 1 is a planar schematic view of an OLED substrate.
Figure 2:
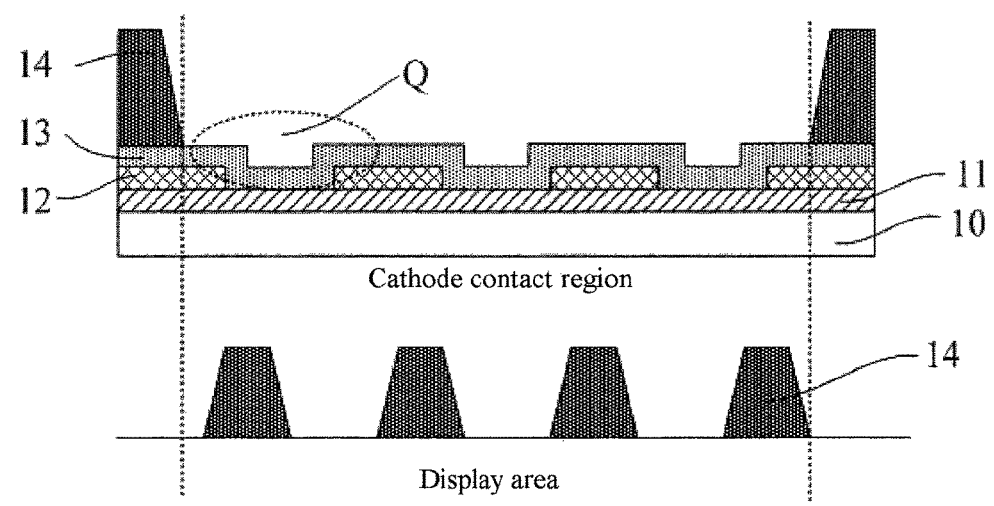
FIG. 2 illustrates comparison between a sectional view of the cathode contact region taken along the line A-A of FIG. 1 and the pixel definition layer of the display area.

The prior art has at least the following problems: because the passivation layer 12 in the cathode contact regions has a plurality of via holes, it is very difficult to clean up the light emitting material that falls into the via hole position Q during the process of forming the light emitting material. The first opening in the display area 1 approximately can accommodate 2-6 Q regions as shown in FIG. 2, while FIG. 1 is only a schematic representation. Therefore, an urgent problem to be solved is avoiding the organic light emitting material from being formed at positions where the via hole is located.

Figure 3:
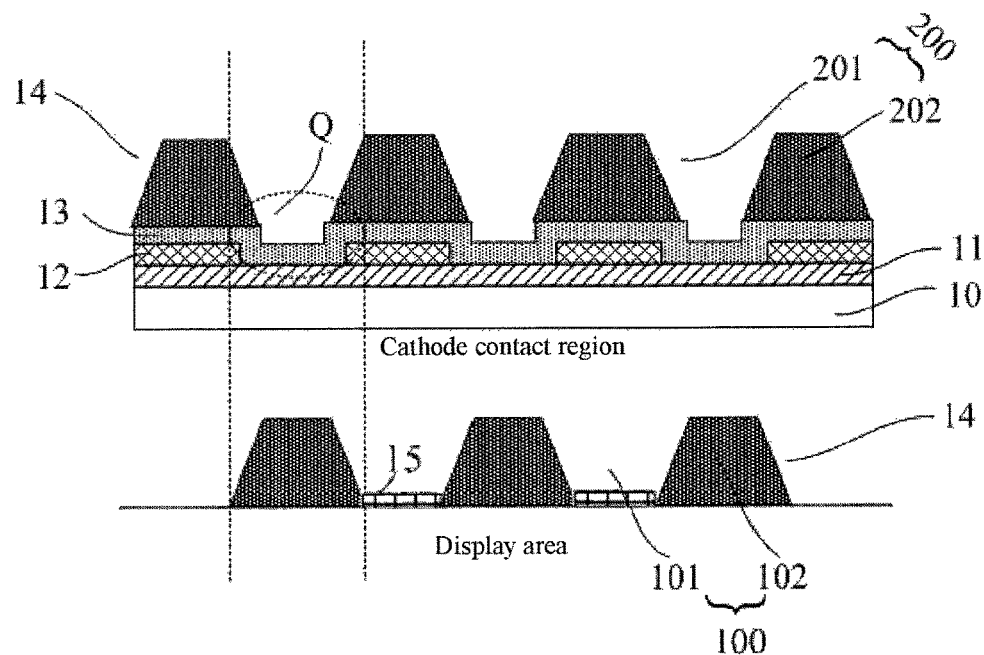
FIG. 3 illustrates the comparison between the pixel definition layer of the OLED cathode contact region and the pixel definition layer of the display area according to an embodiment of the present disclosure.

As shown in FIGS. 1 and 3, an embodiment of the disclosure provides an OLED substrate. Because the planar schematic view of the OLED substrate of this embodiment is same as the prior art, both are represented by FIG. 1. The OLED substrate is divided into a display area 1 and a peripheral area 2 around the display area 1. The peripheral area 2 has a plurality of cathode contact regions 21. The OLED substrate of this embodiment comprises: a base substrate 10; a source-drain metal extending portion 11, arranged on the base substrate 10, and the source-drain metal extending portion 11 extending from the display area 1 to the cathode contact regions 21 of the peripheral area 2; a passivation layer 12, arranged on a layer where the source-drain metal extending portion 11 locates, and the passivation layer 12 having a plurality of via holes at positions corresponding to the cathode contact regions 21; an anode metal extending portion 13, arranged on the passivation layer 12, and the anode metal extending portion 13 extending from the display area 1 to the cathode contact regions 21 of the peripheral area 2 and being electrically connected with the source-drain metal extending portion 11 through the via holes; a pixel definition layer 14, arranged on a layer where the anode metal extending portion 13 locates, and the pixel definition layer 14 having a plurality of successively arranged first patterns 100 at positions corresponding to the display area 1, each of the first patterns 100 having a protrusion portion 102 and a groove portion 101, the pixel definition layer 14 having a plurality of successively arranged second patterns 200 at positions corresponding to the cathode contact regions 21 of the peripheral area 2, each of the second pattern 200 having a protrusion portion 202 and a groove portion 201. The protrusion portion 102 of the first pattern corresponds to the groove portion 201 of the second pattern, and the groove portion 101 of the first pattern corresponds to the protrusion portion 202 of the second pattern.

In this embodiment, the pixel definition layer 14 has a plurality of successively arranged first patterns 100 at positions corresponding to the display area 1 and has a plurality of successively arranged second patterns 200 at positions corresponding to the cathode contact regions 21 of the peripheral area 2, moreover, the protrusion portion 102 of the first pattern corresponds to the groove portion 201 of the second pattern, and the groove portion 101 of the first pattern corresponds to the protrusion portion 202 of the second pattern. In other words, the first pattern 100 and the second pattern 200 are opposite patterns. Therefore, when printing a light emitting material by continuous printing so as to form a light emitting material layer 15 of the OLED device, the light emitting material will not be printed into the groove portion 201 of the second pattern 200 while only being left on the protrusion portion 202 of the second pattern, thus the problem of being difficult to clean up the light emitting material falling into positions Q under the groove portion 201 of the second pattern corresponding to the via holes of the passivation layer 12 is avoided. It should be noted that the continuous printing means printing successively in a row direction or a column direction where the groove portion 101 of the first pattern locates. Since the groove portions and the protrusion portions of the first pattern 100 and the second pattern 200 have exactly opposite positions, when it is printed to the second pattern 200, the light emitting material can only be printed to the position of the protrusion portion of the second pattern 200. It should be noted that in FIG. 3, the groove portion 101 of the first pattern located in the display area 1 for example can correspond to a size of about 2-6 Q positions. FIG. 3 is only a schematic representation.

Respective layer structures of a thin film transistor, e.g. a gate layer, a gate insulating layer, an active layer, a source and a drain etc., can also be arranged on the base substrate 10. The source-drain metal extending portion 11 is arranged in a same layer as the source and the drain.

In certain embodiments, in the OLED substrate according to the embodiment of the present disclosure, a width of the protrusion portion 102 of the first pattern is same as a width of the groove portion 201 of the second pattern, and a width of the groove portion 101 of the first pattern is same as a width of the protrusion portion 202 of the second pattern. The reason why it is set in such a way is for the sake of avoiding as much as possible the problem of being difficult to clean up the light emitting material falling into the groove portion 201 of the second pattern when forming the organic light emitting material layer.

Figure 4:
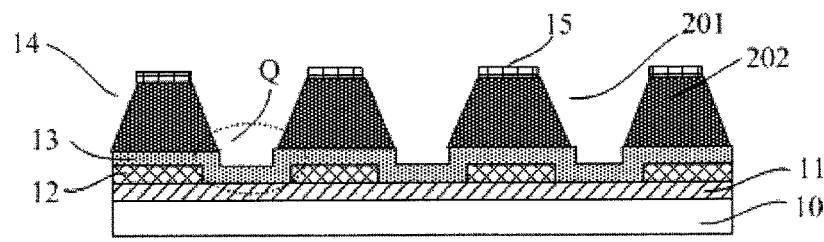
FIG. 4 is a schematic view of forming a light emitting material layer on the basis of FIG. 3.

As shown in FIG. 4, in certain embodiments, the OLED substrate of this embodiment further comprises a light emitting material layer 15. The light emitting material layer 15 is arranged in the groove portion 101 of the first pattern and on the protrusion portion 202 of the second pattern. That is to say, when printing the light emitting material continuously so as to form the light emitting material layer 15, in the display area 1, the light emitting material falls into the groove portion 101 of each first pattern, so as to form a light emitting material layer 15 of each OLED light emitting unit. In the cathode contact regions 21 of the peripheral area 2, the light emitting material falls onto the protrusion portion 202 of the second pattern, thereby enabling the light emitting material to be kept on the protrusion portion 202 of the second pattern while not having to be cleaned up, which improves the production efficiency. Certainly, the light emitting material on the protrusion portion 202 of the second pattern can also be cleaned up. Compared with the existing OLED substrate structure, the difficulty of the cleaning is greatly reduced. Moreover, the material of the pixel definition layer 14 can be a hydrophobic material, hence, when the light emitting material is printed onto the protrusion portion 202 of the second pattern, it will not flow into the groove portion 201 of the second pattern either.

Figure 5:
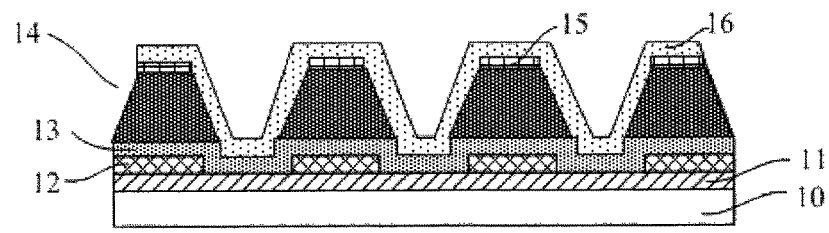
FIG. 5 is a schematic view of forming a cathode metal extending portion on the basis of FIG. 4.

As shown in FIG. 5, further in certain embodiments, the OLED substrate of this embodiment further comprises a cathode, and a cathode metal extending portion 16 connected with the cathode. The cathode and the cathode metal extending portion 16 are arranged on the light emitting material layer 15, and the cathode is arranged in the display area 1. The cathode metal extending portion 16 extends from the display area 1 to the cathode contact regions 21 of the peripheral area 2, and is connected with the anode metal extending portion 13 through the groove portion 201 of the second pattern. Here, a signal required by the cathode can be inputted at the positions of the cathode contact regions 21.

In certain embodiments, the OLED substrate of this embodiment further comprises an anode arranged in the display area 1. The anode is arranged in a same layer as the anode metal extending portion 13 and is disconnected from the anode metal extending portion 13. It can be understood that each OLED light emitting unit formed on the OLED substrate has a separate anode. Each anode is driven by a thin film transistor in a corresponding pixel unit.

The structure of the OLED substrate provided by this embodiment solves the problem of being difficult to clean up the light emitting material of the existing OLED substrate.

Another embodiment of the disclosure provides a manufacturing method of an OLED substrate, which can be used for manufacturing the OLED substrate in Embodiment 1. The manufacturing method comprises:

Step I, forming, on a base substrate 10, a pattern comprising a source-drain metal extending portion 11 through a patterning process, the source-drain metal extending portion 11 extending from a display area 1 to cathode contact regions 21 of a peripheral area 2.

It should be noted that before forming the source-drain metal extending portion 11 on the base substrate 10, the method may further comprise forming respective layer structures of the thin film transistor on the base substrate 10. The source-drain metal extending portion 11 can be formed with the source and the drain of the thin film transistor by one patterning process, so as to simplify the process.

Specifically, the base substrate 10 in this step for example can be made from a transparent material such as glass, resin, sapphire or quartz, and is pre-cleaned. Subsequently, a source-drain metal film can be formed on the base substrate 10 by sputtering, thermal evaporation or chemical vapor deposition (CVD). Photoresist coating, exposing, developing, etching, and photoresist stripping are performed to the source-drain metal film so as to form a pattern comprising the source-drain metal extending portion 11.

The material of the source-drain metal film can be one of Mo, MoNb, Al, AlNd, Ti and Cu. Alternatively, the source-drain metal film can be a monolayer or multilayer composite lamination formed by several materials of the above materials. In certain embodiments, it can be a monolayer or multilayer composite film consisting of Mo, Al or an alloy containing Mo, Al.

Step II, forming a passivation layer 12 on the base substrate 10 where the above step has been performed, and forming a plurality of via holes at positions corresponding to the cathode contact regions 21 in the passivation layer 12 through a patterning process.

Specifically, in this step, the passivation layer 12 can be formed by means of manufacturing processes such as thermal growth, normal pressure CVD, low pressure CVD, plasma assisted CVD or sputtering. Then, a plurality of via holes penetrating through the passivation layer 12 are formed by performing photoresist coating, exposing, developing, etching, and photoresist stripping on the passivation layer 12.

The material of the passivation layer 12 can be SiOx, SiNx, HfOx, SiON, AlOx, etc., alternatively, the passivation layer can consist of multilayer films of two or three of the above materials.

Step III, forming, on the base substrate 10 where the above steps have been performed, a pattern comprising an anode metal extending portion 13 through a patterning process, the anode metal extending portion 13 extending from the display area 1 to the cathode contact regions 21 of the peripheral area 2 and being electrically connected with the source-drain metal extending portion 11 through the via holes.

In certain embodiments, an anode is also formed in the display area 1 at the same time. The anode is disconnected from the anode metal extending portion 13.

Specifically, in this step, an electrically conductive film can be deposited by sputtering, thermal evaporation or chemical vapor deposition, and the anode and the anode metal extending portion 13 can be formed through a patterning process. The anode is electrically connected with the drain of the thin film transistor. The anode metal extending portion 13 is electrically connected with the source-drain metal extending portion 11 through the via hole.

The electrically conductive film can be a structure of ITO/Ag/ITO or a structure of Ag/ITO; alternatively, the ITO in the above structure is replaced with IZO, IGZO or InGaSnO. Certainly, the conductive film can also be formed from an inorganic metal oxide, an organic electrically conductive polymer or a metal material with electrical conductivity and high work function value. The inorganic metal oxide comprises ITO or ZnO. The organic electrically conductive polymer comprises PEDOT:SS, PANT. The metal material comprises gold, copper, silver or platinum.

Step IV, forming a pixel definition layer 14 on the base substrate 10 where the above steps have been performed, and forming a plurality of successively arranged first patterns 100 at positions corresponding to the display area 1 in the pixel definition layer 14 through a patterning process, each of the first patterns 100 having a protrusion portion 102 and a groove portion 101, forming a plurality of successively arranged second patterns 200 at positions corresponding to the cathode contact regions 21 of the peripheral area 2 in the pixel definition layer 14, each of the second pattern 200 having a protrusion portion 202 and a groove portion 201, the protrusion portion 102 of the first pattern corresponding to the groove portion 201 of the second pattern, and the groove portion 101 of the first pattern corresponding to the protrusion portion 202 of the second pattern.

Specifically, in this step, the pixel definition layer 14 can be formed by means of coating. Then, through exposure, development etc., a plurality of first patterns 100 are formed at positions corresponding to the display area 1 in the pixel definition layer 14, and a plurality of second patterns 200 are formed at positions corresponding to the cathode contact regions 21 in the pixel definition layer 14.

The material of the pixel definition layer 14 can be a lyophobic organic fluorine containing material. The width of the protrusion portion 102 of the first pattern for example can be same as the width of the groove portion 201 of the second pattern, and the width of the groove portion 101 of the first pattern for example can be same as the width of the protrusion portion 202 of the second pattern. The reason why it is set in such a way is for the sake of avoiding as much as possible the problem of being difficult to clean up the light emitting material falling into the groove portion 201 of the second pattern when forming the organic light emitting material layer.

Step V, forming a light emitting material layer 15 on the base substrate 10 where the above steps have been performed, the light emitting material layer being formed in the groove portion 101 of the first pattern and on the protrusion portion 202 of the second pattern.

Specifically, in this step, the light emitting material layer can be formed by continuous printing.

Step VI, forming, on the base substrate 10 where the above steps have been performed, a pattern comprising a cathode and a cathode metal extending portion 16 connected with the cathode through a patterning process. The cathode is formed in the display area 1, the cathode metal extending portion 16 extends from the display area 1 to the cathode contact regions 21 of the peripheral area 2 and is connected with the anode metal extending portion 13 through the groove portion 201 of the second pattern.

Specifically, in this step, the cathode and the cathode metal extending portion 16 connected with the cathode can be formed by sputtering or evaporation.

The materials of the cathode and the cathode metal extending portion 16 are low work function metal materials, such as lithium, magnesium, calcium, strontium, aluminum, indium or alloys of the above metals with copper, gold, silver; alternatively, the cathode and the cathode metal extending portion 16 can be composed of a very thin buffer insulating layer (e.g., LiF, $CsCO_3$ etc.) and the above metals or alloys.

Thus, the OLED substrate is formed.

Another embodiment of the disclosure provides a display device comprising the above OLED substrate. The display device can be any product or component with the display function such as a mobile phone, a panel computer, a television, a display, a laptop, a digital photo frame, a navigator etc.

Because the display device of this embodiment comprises the OLED substrate in Embodiment 1, its performance is better.

Certainly, the display device of this embodiment can also comprise other conventional structures, such as a power supply unit, a display driving unit etc.

It can be understood that the above embodiments are only exemplary embodiments for explaining the principle of the present disclosure. However, the present disclosure is not limited to these. For the ordinary skilled person in the art, various modifications and improvements can be made without departing from the spirit and the essence of the present disclosure. These modifications and improvements should also be regarded as falling within the protection scopes of the present disclosure.

The invention claimed is:

1. An OLED substrate comprising:
   a base substrate;
   a source-drain metal extending portion arranged on the base substrate, wherein the OLED substrate is divided into a display area and a peripheral area around the display area,
   wherein the peripheral area has a plurality of cathode contact regions,
   wherein the source-drain metal extending portion is arranged in the cathode contact regions of the peripheral area;
   a passivation layer arranged over the source-drain metal extending portion, the passivation layer having a plurality of via holes at positions corresponding to the cathode contact regions;
   an anode metal extending portion arranged on the passivation layer, and the anode metal extending portion is arranged in the cathode contact regions of the peripheral area and being electrically connected with the source-drain metal extending portion through the via holes;
   a pixel definition layer arranged over the anode metal extending portion, and the pixel definition layer having a plurality of successively arranged first patterns at positions corresponding to the display area, each of the first patterns having a protrusion portion and a groove portion; the pixel definition layer having a plurality of successively arranged second patterns at positions corresponding to the cathode contact regions, each of the second patterns having a protrusion portion and a groove portion, wherein on a boundary between the display area and the peripheral area, a width of the protrusion portion of the first pattern is substantially equal to and aligned with a width of the groove portion of the second pattern, and a width of the groove portion of the first pattern is substantially equal to and aligned with a width of the protrusion portion of the second pattern.

2. The OLED substrate according to claim 1, wherein a width of the protrusion portion of the first pattern is same as a width of the groove portion of the second pattern, and a width of the groove portion of the first pattern is same as a width of the protrusion portion of the second pattern.

3. The OLED substrate according to claim 1, further comprising a light emitting material layer arranged in the groove portion of the first pattern and on the protrusion portion of the second pattern.

4. The OLED substrate according to claim 3, further comprising a cathode and a cathode metal extending portion connected with the cathode, wherein the cathode and the cathode metal extending portion are arranged on the light emitting material layer, the cathode metal extending portion is arranged in the cathode contact regions of the peripheral area and is connected with the anode metal extending portion through the groove portion of the second pattern.

5. A display device comprising an OLED substrate according to claim 1.

6. The display device according to claim 5, wherein a width of the protrusion portion of the first pattern is same as a width of the groove portion of the second pattern, and a width of the groove portion of the first pattern is same as a width of the protrusion portion of the second pattern.

7. The display device according to claim 5, wherein the OLED substrate further comprises a light emitting material layer, wherein the light emitting material layer is arranged in the groove portion of the first pattern and on the protrusion portion of the second pattern.

8. The display device according to claim 7, wherein the OLED substrate further comprises a cathode and a cathode metal extending portion connected with the cathode, wherein the cathode and the cathode metal extending portion are arranged on the light emitting material layer, the cathode metal extending portion is arranged in the cathode contact regions of the peripheral area and is connected with the anode metal extending portion through the groove portion of the second pattern.

9. A method of manufacturing an OLED substrate, comprising:
   forming a pattern on a base substrate through a patterning process, wherein the pattern comprises a source-drain metal extending portion, wherein the source-drain metal extending portion is arranged in cathode contact regions of a peripheral area;
   forming a passivation layer on the base substrate and forming a plurality of via holes at positions corresponding to the cathode contact regions in the passivation layer through a patterning process;
   forming a pattern comprising an anode metal extending portion through a patterning process, wherein the anode metal extending portion is arranged in the cathode contact regions of the peripheral area and is electrically connected with the source-drain metal extending portion through the via holes;
   forming a pixel definition layer on the base substrate and forming a plurality of successively arranged first patterns at positions corresponding to a display area in the pixel definition layer through a patterning process, each of the first patterns having a protrusion portion and a groove portion, forming a plurality of successively arranged second patterns at positions corresponding to the cathode contact regions of the peripheral area in the pixel definition layer, each of the second pattern having a protrusion portion and a groove portion, wherein in a direction perpendicular to a boundary between the display area and the peripheral area, a width of the protrusion portion of the first pattern is substantially equal to and aligned with a width of the groove portion of the second pattern, and a width of the groove portion of the first pattern is substantially equal to and aligned with a width of the protrusion portion of the second pattern.

10. The method of claim 9, wherein a width of the protrusion portion of the first pattern is same as a width of the groove portion of the second pattern, and a width of the groove portion of the first pattern is same as a width of the protrusion portion of the second pattern.

11. The method of claim 9, wherein the method further comprises:

forming a light emitting material layer, wherein the light emitting material layer is formed in the groove portion of the first pattern and on the protrusion portion of the second pattern.

12. The method of claim 11, wherein the light emitting material layer is formed by continuous printing.

13. The method of claim 12, wherein the method further comprises:

forming a pattern comprising a cathode and a cathode metal extending portion connected with the cathode through a patterning process, wherein the cathode and the cathode metal extending portion are arranged on the light emitting material layer, the cathode metal extending portion is arranged in the cathode contact regions of the peripheral area and is connected with the anode metal extending portion through the groove portion of the second pattern.

* * * * *